(12) United States Patent
Xavier

(10) Patent No.: US 6,609,239 B1
(45) Date of Patent: Aug. 19, 2003

(54) EFFICIENT INTEGRATED CIRCUIT LAYOUT FOR IMPROVED MATCHING BETWEEN I AND Q PATHS IN RADIO RECEIVERS

(75) Inventor: Bernard Xavier, Encinitas, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/935,914

(22) Filed: Aug. 23, 2001

(51) Int. Cl.[7] ................................................ G06F 9/45

(52) U.S. Cl. .......................................... 716/10; 716/11

(58) Field of Search ....................... 716/4, 10; 455/302, 455/307, 323, 324; 342/417, 437

(56) References Cited

U.S. PATENT DOCUMENTS 5,148,180 A * 9/1992 Beyer et al. ................. 342/437
6,226,509 B1 * 5/2001 Mole et al. .................. 455/302

* cited by examiner

*Primary Examiner*—Vuthe Siek
*Assistant Examiner*—Naum Levin

(57) ABSTRACT

An integrated circuit is disclosed that provides improved matching between I and Q paths in radio receiver circuits. The integrated circuit comprises at least one circuit element that is divided into a first half strength circuit element located in a first area of a module and a second half strength circuit element located in a second area of the module. The first and second areas are oppositely located with respect to a central area of the module and minimize component mismatch by averaging out process gradients within the module. Methods for laying out the circuit elements of the integrated circuit are also disclosed.

20 Claims, 3 Drawing Sheets

EFFICIENT INTEGRATED CIRCUIT LAYOUT FOR IMPROVED MATCHING BETWEEN I AND Q PATHS IN RADIO RECEIVERS

FIELD OF THE INVENTION

The present invention relates in general to integrated circuit technology and in particular to arrangements of circuit elements within an integrated circuit.

BACKGROUND OF THE INVENTION

"Image response" is a well-known limitation in heterodyne wireless receivers. "Image response" occurs when an unwanted radio frequency (RF) component is mixed down to interface frequencies (IF) as a result of the process of mixing. The occurrence of "image response" imposes severe filtering requirements on a receiver. Image rejection mixer circuits have been devised to solve the problem of "image response." Image rejection mixer circuits are widely used in many types of RF receivers. A typical image rejection mixer circuit is schematically illustrated in FIG. 1.

An "image frequency" is a frequency that (when mixed with a local oscillator frequency) is converted to the same interface frequency (IF) as the desired RF channel frequencies. In an image rejection mixer circuit both the desired RF channel frequencies and the "image frequency" are frequency converted into two paths (an in-phase "I" path and a quadrature "Q" path). This is accomplished by mixers driven by quadrature phases (i.e., a sine wave (I) and a cosine wave (Q)) of the local oscillator frequency.

The mixer outputs are then filtered and phase shifted ninety degrees (90°) with respect to each other. The sum of these two signals will select the desired RF channel frequencies while suppressing the image frequency.

The extent of suppression of the image frequency that can be achieved is a critical quality of a receiver. The extent of suppression of the image frequency that can be achieved depends heavily on the gain and phase matching between the two mixer paths. In direct down receivers (i.e., zero IF receivers) any imbalance between the signals in the I path and in the Q path can be very critical due to large direct current (DC) errors introduced into the down converted output.

An image rejection mixer circuit is usually implemented in an integrated circuit. FIG. 2 illustrates a conventional arrangement for laying out two gain blocks and two mixer blocks of an image rejection mixer circuit. It is well known that matching between identical blocks in an integrated circuit depends heavily on the relative position of the blocks with respect to each other. Traditionally, integrated circuit mask designers lay out each signal path independently. The completed blocks of each signal path are then placed next to each other. This is an efficient approach to the actual process of laying out the blocks. However, this approach results in non-optimum matching characteristics between the blocks.

It would be desirable to provide an improved integrated circuit layout in an image rejection mixer circuit. It would also be desirable to provide an improved integrated circuit layout in other types of circuits that have an I path and a Q path. It would be desirable to provide an improved integrated circuit that is capable of providing improved matching between an I path and a Q path in radio receiver circuits.

SUMMARY OF THE INVENTION

The apparatus and method of the present invention is capable of providing improved matching between an I path and a Q path in a radio receiver circuit. The apparatus generally comprises at least one circuit element that is divided into a first half strength circuit element located in a first area of a module and a second half strength circuit element located in a second area of the module. The first and second areas are oppositely located with respect to a central area of the module and minimize component mismatch by averaging out process gradients within the module.

It is an object of the present invention to provide an improved integrated circuit layout in an image rejection mixer circuit.

It is also an object of the present invention to provide an improved integrated circuit layout in a circuit of the type having an I path and a Q path.

It is another object of the present invention to provide an apparatus and method for providing improved matching between an I path and a Q path in a radio receiver circuit.

Other objects and advantages of the invention will become apparent as the description proceeds.

The foregoing has outlined rather broadly the features and technical advantages of the present invention so that those skilled in the art may better understand the Detailed Description of the Invention that follows. Additional features and advantages of the invention will be described hereinafter that form the subject matter of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention, it may be advantageous to set forth definitions of certain words and phrases used throughout this patent document: The terms "include" and "comprise" and derivatives thereof, mean inclusion without limitation, the term "or" is inclusive, meaning "and/or"; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, to bound to or with, have, have a property of, or the like; and the term "controller," "processor," or "apparatus" means any device, system or part thereof that controls at least one operation. Such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document. Those of ordinary skill should understand that in many instances (if not in most instances), such definitions apply to prior, as well as future uses of such defined words and phrases.

BRIEF DESCRIPTION OF THE DRAWINGS

For a more complete understanding of the present invention, and the advantages thereof, reference is now made to the following descriptions taking in conjunction with the accompanying drawings, wherein like numbers designate like objects, and in which.

DETAILED DESCRIPTION OF THE INVENTION

Figure 1:
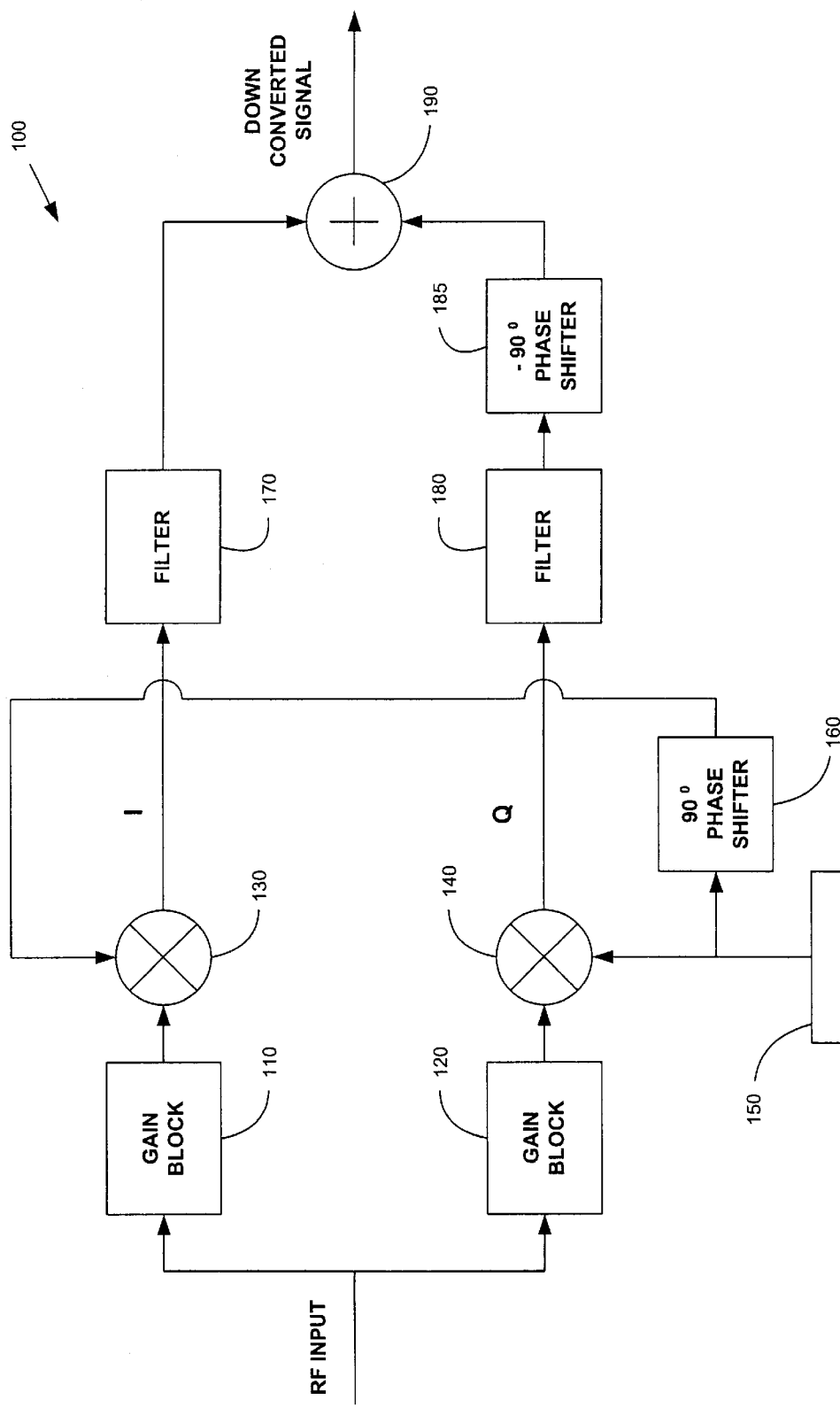
FIG. 1 schematically illustrates a prior art image rejection mixer circuit of an RF radio receiver.

FIG. 1 schematically illustrates an image rejection mixer circuit 100 of an RF radio receiver. As previously described, image rejection mixer circuit 100 suppresses an image frequency to suppress "image response" in an RF radio receiver. Image rejection mixer circuit 100 receives a RF input into gain block 110 and gain block 120. Gain block 110 and gain block 120 each amplify the RF input signal. A signal from local oscillator 150 is combined with the output of gain block 120 in mixer 140 to create a quadrature (Q) signal. A signal from local oscillator 150 is phase shifted ninety degrees (90°) in phase shifter circuit 160 and is then combined with the output of gain block 110 in mixer 130 to create an in-phase (I) signal.

The I signal from mixer 130 is filtered in filter 170. The Q signal from mixer 140 is filtered in filter 180. The output of filter 180 is negatively phase shifted ninety degrees (90°) in phase shifter circuit 185 and is then combined with the output of filter 170 in adder 190. The output of adder 190 represents a down converted signal in which the image frequency has been suppressed.

Figure 2:
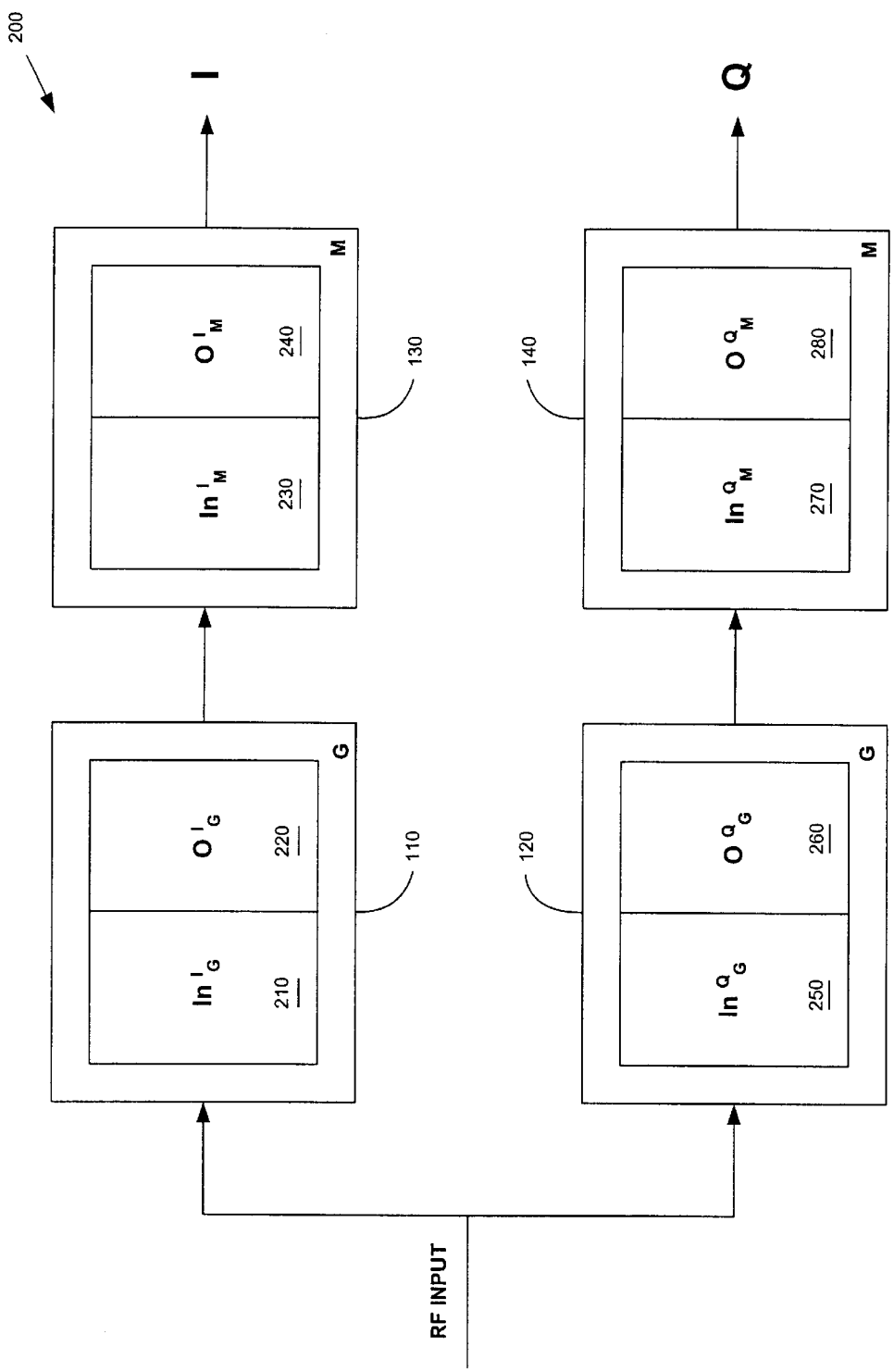
FIG. 2 is a layout diagram that schematically illustrates a prior art integrated circuit arrangement of two gain blocks and two mixer blocks of an image rejection mixer circuit.

FIG. 2 is an integrated circuit layout diagram 200 that schematically illustrates a prior art integrated circuit arrangement of gain block 110 and gain block 120 and mixer 130 and mixer 140 of image rejection mixer circuit 100. Gain block 110 in the I path comprises an input stage block 210 and an output stage block 220. Input stage block 210 is designated with the letters $In_G^I$. The letters "In" designate "input block." The superscript letter "I" designates the I path and the subscript letter "G" designates "gain block." Similarly, the output stage block 220 of gain block 110 is designated with the letters $O_G^I$. The letter "o" designates "output block." The superscript letter I and the subscript letter G have the same meaning as before. The letter G in the lower right hand corner of gain block 110 indicates that gain block 110 is a gain block.

Similarly, gain block 120 in the Q path comprises an input stage block 250 and an output stage block 260. Input stage block 250 is designated with the letters $In_G^Q$. The letters "In" designate "input block." The superscript letter "Q" designates the Q path and the subscript letter "G" designates "gain block." Output stage block 260 of gain block 120 is designated with the letters $O_G^Q$. The letter "O" designates "output block." The superscript letter Q and the subscript letter G have the same meaning as before. The letter G in the lower right hand corner of gain block 120 indicates that gain block 120 is a gain block.

In the integrated circuit layout diagram 200 in FIG. 2, gain block 110 within the I path and gain block 120 within the Q path are laid out side by side. That is, gain block 110 and gain block 120 are connected in parallel because the I path and the Q path are parallel paths.

Mixer block 130 is coupled to gain block 110 in the I path. Mixer block 130 comprises an input stage block 230 and an output stage block 240. Input stage block 230 is designated with the letters $In_M^I$. As before, the letters "In" designate "input block." The superscript letter "I" designates the I path and the subscript letter "M" designates "mixer block." Similarly, output stage block 240 of mixer block 130 is designated with the letters $O_M^I$. The letter "O" designates "output block." The superscript letter I and the subscript letter M have the same meaning as before. The letter M in the lower right hand corner of mixer block 130 indicates that mixer block 130 is a mixer block.

Mixer block 140 is coupled to gain block 120 in the Q path. Mixer block 140 comprises an input stage block 270 and an output stage block 280. Input stage block 270 is designated with the letters $In_M^Q$. As before, the letters "In" designate "input block." The superscript letter "Q" designates the Q path and the subscript letter "M" designates "mixer block." Similarly, output stage block 280 of mixer block 140 is designated with the letters $O_M^Q$. The letter "O" designates "output block." The superscript letter Q and the subscript letter M have the same meaning as before. The letter M in the lower right hand corner of mixer block 140 indicates that mixer block 140 is a mixer block.

In the integrated circuit layout diagram 200 in FIG. 2, mixer block 130 in the I path and mixer block 140 in the Q path are laid out side by side. That is, the series combination of gain block 110 and mixer block 130 is connected in parallel with the series combination of gain block 120 and mixer block 140. This is because the I path and the Q path are parallel paths.

Figure 3:
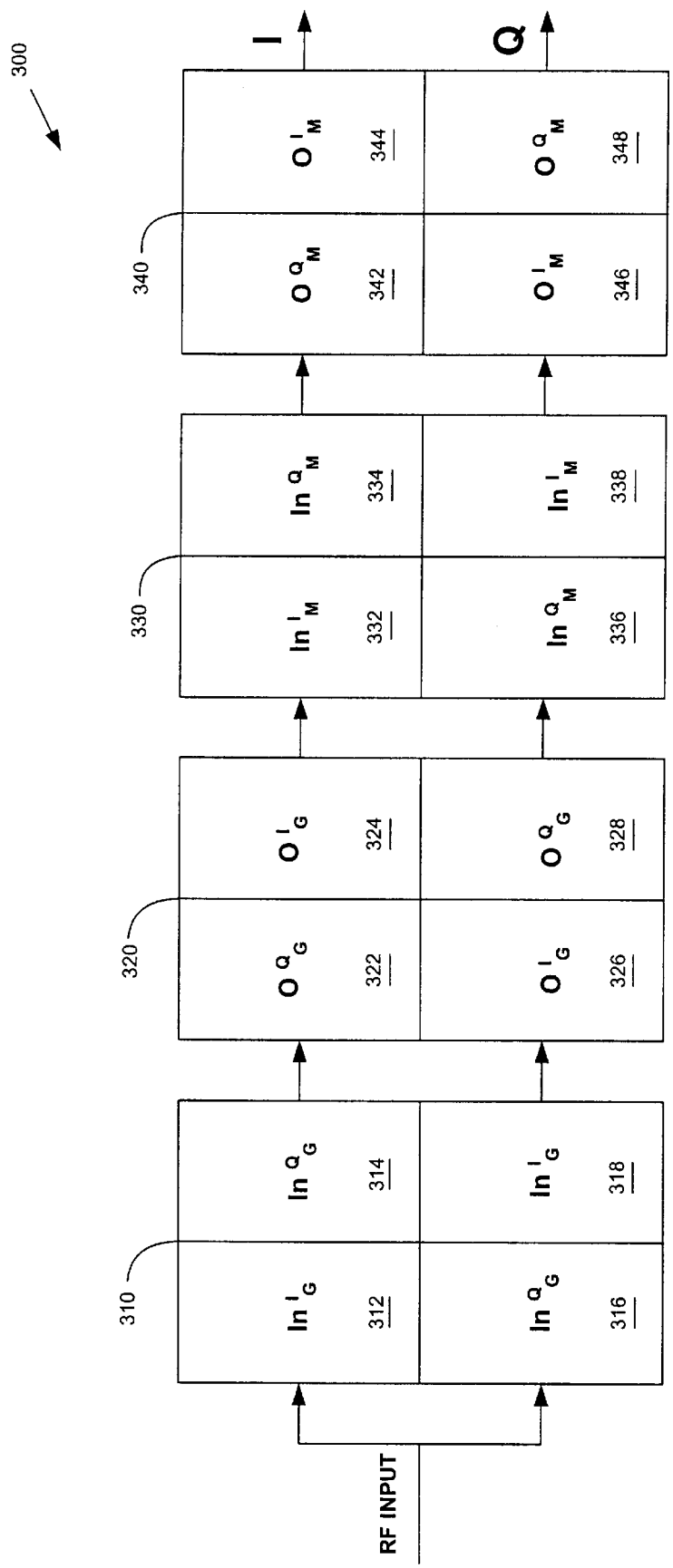
FIG. 3 is a layout diagram that schematically illustrates an integrated circuit arrangement of two gain blocks and two mixer blocks of an image rejection mixer circuit in accordance with the principles of the present invention.

FIG. 3 is an integrated circuit layout diagram 300 that schematically illustrates an arrangement of gain block 110 and gain block 120 and mixer 130 and mixer 140 of image rejection mixer circuit 100 in accordance with the principles of the present invention. The layout diagram 300 schematically illustrated in FIG. 3 provides better matching between the I path and the Q path of image rejection mixer circuit 100.

In the present invention input stage block 210 of I gain block 110 is subdivided into two identical blocks. Specifically, input stage block 210 is divided into input stage block 312 and input stage block 318. Further, output stage block 220 of I gain block 110 is subdivided into two identical blocks. Specifically, output stage block 220 is divided into output stage block 324 and output stage block 326.

Similarly, input stage block 250 of Q gain block 120 is subdivided into two identical blocks. Specifically, input stage block 250 is divided into input stage block 314 and input stage block 316. Further, output stage block 260 of Q gain block 120 is subdivided into two identical blocks. Specifically, output stage block 260 is divided into output stage block 322 and output stage block 328.

In addition, input stage block 230 and output stage block 240 of I mixer block 130 are each subdivided into two identical blocks. Specifically, input stage block 230 is divided into input stage block 332 and input stage block 338. Further, output stage block 240 of I mixer block 130 is subdivided into two identical blocks. Specifically, output stage block 240 is divided into output stage block 344 and output stage block 346.

Similarly, input stage block 270 and output stage block 280 of Q mixer block 140 are each subdivided into two identical blocks. Specifically, input stage block 270 is divided into input stage block 334 and input stage block 336. Further, output stage block 280 of Q mixer block 140 is subdivided into two identical blocks. Specifically, output stage block 280 is divided into output stage block 342 and output stage block 348.

Each block of a set of two identical blocks is referred to as a "half strength" circuit. The term "half strength" refers to the fact that when the two identical blocks are connected in parallel, they produce the same electrical output that is produced by the block from which the two identical blocks were derived. For example, input stage block 312 and input stage block 318 are each "half strength" blocks with respect to input stage block 210. When input stage block 312 and input stage block 318 are connected in parallel, they produce the same electrical output that is produced by input stage block 210.

In accordance with the principles of the present invention, the above described "half strength" blocks are laid out within an integrated circuit in a common centroid arrangement. One advantageous embodiment of a common centroid arrangement is illustrated in FIG. 3. A common centroid arrangement significantly improves the matching between the I path circuitry and the Q path circuitry. This is because any process gradient in the x direction or in the y direction in an integrated circuit (e.g., due to the manufacturing process) is averaged out by the common centroid arrangement of the layout of the I and Q circuit elements.

An advantageous embodiment of the common centroid arrangement of the present invention is shown in FIG. 3. Gain input module 310 comprises input stage block 312, input stage block 314, input stage block 316 and input stage block 318. The I path through gain input module 310 passes first through input stage block 312 and then through input stage block 310. Input stage block 312 occupies the upper left hand corner of gain input module 310 and input stage block 318 occupies the lower right hand corner of gain input module 310. Input stage block 312 and input block 318 therefore occupy diametrically opposed areas of gain input module 310.

The Q path through gain input module 310 passes first through input stage block 316 and then through input stage block 314. Input stage block 316 occupies the lower left hand corner of gain input module 310 and input stage block 314 occupies the upper right hand corner of gain input module 310. Input stage block 316 and input stage block 314 therefore occupy diametrically opposed areas of gain input module 310.

In this manner the input stage blocks 312, 314, 316, 318 that make up gain input module 310 are symmetrically arranged around the central area of gain input module 310. This "centroid" arrangement of the input stage blocks 312, 314, 316, 318 of gain input module 310 averages out any process gradients within gain input module 310.

As shown in FIG. 3, gain output module 320 is connected to gain input module 310. Gain output module 320 comprises output stage block 322, output stage block 324, output stage block 326 and output stage block 328. The I path passes from input stage block 318 of gain input module 310 to output stage block 326 of gain output module 320. The I path through gain output module 320 passes through output stage block 326 and then through output stage block 324. Output stage block 326 occupies the lower left hand corner of gain output module 320 and output stage block 324 occupies the upper right hand corner of gain output module 320. Output stage block 324 and output stage block 326 therefore occupy diametrically opposed areas of gain output module 320.

The Q path passes from input stage block 314 of gain input module 310 to output stage block 322 of gain output module 320. The Q path through gain output module 320 passes through output stage block 322 and then through output stage block 328. Output stage block 322 occupies the upper left hand corner of gain output module 320 and output stage block 328 occupies the lower right hand corner of gain output module 320. Output stage block 322 and output stage block 328 therefore occupy diametrically opposed areas of gain output module 320.

In this manner the output stage blocks 322, 324, 326, 328 that make up gain output module 320 are symmetrically arranged around the central area of gain output module 320. This "centroid" arrangement of the output stage blocks 322, 324, 326, 328 of gain output module 320 averages out any process gradients within gain output module 320.

As also shown in FIG. 3, mixer input module 330 is connected to gain output module 320. Mixer input module 330 comprises input stage block 332, input stage block 334, input stage block 336 and input stage block 338. The I path passes from output stage block 324 of gain output module 320 to input stage block 332 of mixer input module 330. The I path through mixer input module 330 passes through input stage block 332 and then through input stage block 338. Input stage block 332 occupies the upper left hand corner of mixer input module 330 and input stage block 338 occupies the lower right hand corner of mixer input module 330. Input stage block 332 and input stage block 338 therefore occupy diametrically opposed areas of mixer input module 330.

The Q path passes from output stage block 324 of gain output module 320 to input stage block 332 of mixer input module 330. The Q path through mixer input module 330 passes through input stage block 332 and then through input stage block 338. Input stage block 332 occupies the upper left hand corner of mixer input module 330 and input stage block 338 occupies the lower right hand corner of mixer input module 330. Input stage block 332 and input stage block 338 therefore occupy diametrically opposed areas of mixer input module 330.

In this manner the input stage blocks 332, 334, 336, 338 that make up mixer input module 330 are symmetrically arranged around the central area of mixer input module 330. This "centroid" arrangement of the input stage blocks 332, 334, 336, 338 of mixer input module 330 averages out any process gradients within mixer input module 330.

As also shown in FIG. 3, mixer output module 340 is connected to mixer input module 330. Mixer output module 340 comprises output stage block 342, output stage block 344, output stage block 346 and output stage block 348. The I path passes from input stage block 338 of mixer input module 330 to output stage block 346 of mixer output module 340. The I path through mixer output module 340 passes through output stage block 346 and then through output stage block 344. Output stage block 346 occupies the lower left hand corner of mixer output module 340 and output stage block 344 occupies the upper right hand corner of mixer output module 340. Output stage block 346 and output stage block 344 therefore occupy diametrically opposed areas of mixer output module 340.

The Q path passes from input stage block 334 of mixer input module 330 to output stage block 342 of mixer output module 340. The Q path through mixer output module 340 passes through output stage block 342 and then through output stage block 348. Output stage block 342 occupies the upper left hand corner of mixer output module 340 and output stage block 348 occupies the lower right hand corner of mixer output module 340. Output stage block 342 and output stage block 348 therefore occupy diametrically opposed areas of mixer output module 340.

In this manner the output stage blocks 342, 344, 346, 348 that make up mixer output module 340 are symmetrically arranged around the central area of mixer output module 340. This "centroid" arrangement of the output stage blocks 342, 344, 346, 348 of mixer output module 340 averages out any process gradients within mixer output module 340.

In the advantageous embodiment of the present invention shown in FIG. 3, the I path output from mixer output module 340 is from output stage block 344 and the Q path output from mixer output module 340 is from output stage block 348.

It is understood that the present invention is not limited to the particular advantageous embodiment of the invention shown in FIG. 3. The division of a circuit element into two identical "half strength" circuits and a symmetrical "centroid" arrangement of the two identical "half strength" circuits is not limited to input stages and output stages of a circuit element. The principles of the present invention may be applied to any type of partitioning of circuit element functions. The description of the invention with reference to partitioning circuit elements into input stages and output stages is merely one illustrative example. The present invention may be used with other types of circuit element partitioning.

In addition, it is understood that the present invention is not limited to use in an image rejection mixer circuit. The principles of the present invention may be applied to any two electrical paths where good inter-path matching properties are desired. The description of the invention with reference to an image rejection mixer circuit is merely one illustrative example.

The principles of the present invention may be used in any integrated circuit where two signal paths must be matched. It is understood that the present invention may be used to optimize component mismatch between transistors, capacitors, resistors, and other active devices in an integrated circuit.

The component layout arrangement provided by the present invention may be used to improve the relative tracking of two signal paths in numerous types of circuits. Specific examples of circuits that require an in-phase signal path and a quadrature signal path include: (1) a direct conversion radio receiver, (2) a near direct conversion radio receiver, (3) an image rejection mixer, (4) single sideband upconverting mixer, (5) a quadrature modulator, and (6) a quadrature demodulator. It is understood that this list is not exhaustive and that other types of circuits may exist in which the present invention may be used.

The above examples and description have been provided only for the purpose of illustration, and are not intended to limit the invention in any way. As will be appreciated by the skilled person, the invention can be carried out in a great variety of ways, employing more than one technique from those described above, all without exceeding the scope of the invention.

What is claimed is:

1. A method for placing circuit elements within an integrated circuit comprising the steps of:

dividing at least one circuit element of said integrated circuit into a first half strength circuit element and a second half strength circuit element;

placing said first half strength circuit element in a first area of a module of said integrated circuit;

placing said second half strength circuit element in a second area of said module of said integrated circuit;

wherein said first area and said second area are oppositely located with respect to a central area of said module of said integrated circuit.

2. A method as claimed in claim 1 wherein said at least one circuit element comprises an input circuit element.

3. A method as claimed in claim 1 wherein said at least one circuit element comprises an output circuit element.

4. A method for placing circuit elements within an integrated circuit of the type comprising an in-phase (I) path and a quadrature (Q) path, said method comprising the steps of:

dividing at least one I path circuit element of said integrated circuit into a first I path half strength circuit element and a second I path half strength circuit element;

dividing at least one Q path circuit element of said integrated circuit into a first Q path half strength circuit element and a second Q path half strength circuit element;

placing said first I path half strength circuit element in a first area of a module of said integrated circuit;

placing said second I path half strength circuit element in a second area of said module of said integrated circuit;

wherein said first area and said second area are oppositely located with respect to a central area of said module;

placing said first Q path half strength circuit element in a third area of said module of said integrated circuit;

placing said second Q path half strength circuit element in a fourth area of said module of said integrated circuit;

wherein said third area and said fourth area are oppositely located with respect to a central area of said module of said integrated circuit.

5. A method as claimed in claim 4 wherein said at least one I path circuit element of said integrated circuit comprises an input circuit element and wherein said at least one Q path circuit element of said integrated circuit comprises an input circuit element.

6. A method as claimed in claim 4 wherein said at least one I path circuit element of said integrated circuit comprises an output circuit element and wherein said at least one Q path circuit element of said integrated circuit comprises an output circuit element.

7. A method as claimed in claim 4 wherein said integrated circuit of the type comprising an in-phase (I) path and a quadrature (Q) path comprises one of: a direct conversion radio receiver, a near direct conversion radio receiver, an image rejection mixer, a single sideband upconverting modulator, a quadrature modulator, and a quadrature demodulator.

8. A method for minimizing component mismatch between circuit elements within an integrated circuit in which it is desired to match a first signal path and a second signal path, said method comprising the steps of:

dividing at least one circuit element in said first signal path of said integrated circuit into a first half strength circuit element and a second half strength circuit element;

placing said first half strength circuit element in a first area of a module of said integrated circuit;

placing said second half strength circuit element in a second area of said module of said integrated circuit;

wherein said first area and said second area are oppositely located with respect to a central area of said module; and wherein said opposite locations of said first area and of said second area average out at least one process gradient of said module.

9. A method as claimed in claim 8 further comprising the steps of:

dividing at least one circuit element in said second signal path of said integrated circuit into a first half strength circuit element of said second signal path and a second half strength circuit element of said second signal path;

placing said first half strength circuit element of said second signal path in a third area of said module of said integrated circuit;

placing said second half strength circuit element of said second signal path in a fourth area of said module of said integrated circuit;

wherein said third area and said fourth area are oppositely located with respect to a central area of said module; and wherein said opposite locations of said third area and of said fourth area average out at least one process gradient of said module.

10. A method as claimed in claim 9 wherein said first signal path comprises an in-phase (I) path and wherein said second signal path comprises a quadrature (Q) path.

11. An integrated circuit comprising at least one circuit element that is divided into a first half strength circuit element and a second half strength circuit element;

wherein said first half strength circuit element is located in a first area of a module of said integrated circuit;

wherein said second half strength circuit element is located in a second area of said module of said integrated circuit; and wherein said first area and said second area are oppositely located with respect to a central area of said module of said integrated circuit.

12. An integrated circuit as claimed in claim 11 wherein said at least one circuit element comprises an input circuit element.

13. An integrated circuit as claimed in claim 11 wherein said at least one circuit element comprises an output circuit element.

14. An integrated circuit of the type comprising an in-phase (I) path and a quadrature (Q) path, said integrated circuit comprising:

at least one I path circuit element that is divided into a first I path half strength circuit element and a second I path half strength circuit element;

at least one Q path circuit element that is divided into a first Q path half strength circuit element and a second Q path half strength circuit element;

wherein said first I path half strength circuit element is located in a first area of a module of said integrated circuit;

wherein said second I path half strength circuit element is located in a second area of said module of said integrated circuit;

wherein said first area and said second area are oppositely located with respect to a central area of said module of said integrated circuit;

wherein said first Q path half strength circuit element is located in a third area of said module of said integrated circuit;

wherein said second Q path half strength circuit element is located in a fourth area of said module of said integrated circuit; and wherein said third area and said fourth area are oppositely located with respect to a central area of said module of said integrated circuit.

15. An integrated circuit as claimed in claim 14 wherein said at least one I path circuit element of said integrated circuit comprises an input circuit element and wherein said at least one Q path circuit element of said integrated circuit comprises an input circuit element.

16. An integrated circuit as claimed in claim 14 wherein said at least one I path circuit element of said integrated circuit comprises an output circuit element and wherein said at least one Q path circuit element of said integrated circuit comprises an output circuit element.

17. An integrated circuit as claimed in claim 14 comprising one of: a direct conversion radio receiver, a near direct conversion radio receiver, an image rejection mixer, a single sideband upconverting modulator, a quadrature modulator, and a quadrature demodulator.

18. An integrated circuit having minimized component mismatch between circuit elements in which it is desired to match a first signal path and a second signal path, said integrated circuit comprising:

at least one circuit element in said first signal path of said integrated circuit divided into a first half strength circuit element and a second half strength circuit element;

wherein said first half strength circuit element is located in a first area of a module of said integrated circuit;

wherein said second half strength circuit element is located in a second area of said module of said integrated circuit;

wherein said first area and said second area are oppositely located with respect to a central area of said module of said integrated circuit; and wherein said opposite locations of said first area and of said second area average out at least one process gradient of said module of said integrated circuit.

19. An integrated circuit as claimed in claim 18 further comprising:

at least one circuit element in said second signal path of said integrated circuit divided into a first half strength circuit element of said second signal path and a second half strength circuit element of said second signal path;

wherein said first half strength circuit element of said second signal path is located in a third area of said module of said integrated circuit;

wherein said second half strength circuit element of said second signal path is located in a fourth area of said module of said integrated circuit;

wherein said third area and said fourth area are oppositely located with respect to a central area of said module of said integrated circuit; and wherein said opposite locations of said third area and of said fourth area average out at least one process gradient of said module of said integrated circuit.

20. An integrated circuit as claimed in claim 19 wherein said first signal path comprises an in-phase (I) path and wherein said second signal path comprises a quadrature (Q) path.

* * * * *